United States Patent
Park et al.

(10) Patent No.: US 8,507,906 B2
(45) Date of Patent: Aug. 13, 2013

(54) CMOS IMAGE SENSOR AND METHOD OF MANUFACTURING THE SAME

(75) Inventors: Sung-ho Park, Yongin-si (KR); I-hun Song, Seongnam-si (KR); Wook Lee, Anyang-si (KR); Sang-wook Kim, Yongin-si (KR); Sun-il Kim, Yongin-si (KR); Jae-chul Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 830 days.

(21) Appl. No.: 12/591,909

(22) Filed: Dec. 4, 2009

(65) Prior Publication Data

US 2010/0283048 A1    Nov. 11, 2010

(30) Foreign Application Priority Data

May 8, 2009    (KR) .................. 10-2009-0040323

(51) Int. Cl.
*H01L 31/032* (2006.01)
*H01L 21/00* (2006.01)

(52) U.S. Cl.
USPC ............... 257/43; 257/E31.026; 438/85

(58) Field of Classification Search
USPC ................. 257/59, 43, 222; 438/85
See application file for complete search history.

(56) References Cited

U.S. PATENT DOCUMENTS

| 2008/0083939 A1 | 4/2008 | Guidash |
| 2008/0251823 A1 | 10/2008 | Lee |

FOREIGN PATENT DOCUMENTS

| JP | 2007-243093 | 9/2007 |
| KR | 10-2000-0038298 | 7/2000 |
| KR | 10-2001-0088443 | 9/2001 |
| KR | 10-2006-0077173 | 7/2006 |
| KR | 10-2008-0027261 | 3/2008 |
| KR | 10-0825808 | 4/2008 |
| WO | WO 2008/156274 A1 | 12/2008 |

OTHER PUBLICATIONS

European Search Report dated Apr. 23, 2012 in corresponding European Application No. 10152306.
Hwang, et al., "Technical Trends of Transparent Devices," *Electronics and Communications Trends*, vol. 22, Issue 5, pp. 46-56 (Oct. 2007).

*Primary Examiner* — William D Coleman
(74) *Attorney, Agent, or Firm* — Harness, Dickey & Pierce, P.L.C.

(57) ABSTRACT

Provided is a complementary metal oxide semiconductor (CMOS) image sensor having a structure capable of increasing areas of photodiodes in unit pixels and expanding light receiving areas of the photodiodes. In the CMOS image sensor, transfer transistors may be formed on the photodiode, and reset transistors, source follower transistors, and selection transistors may be formed on a layer on which the transfer transistors are not formed. In such a CMOS image sensor, the areas of the photodiodes may be increased in unit pixels so that a size of the unit pixels may be reduced and sensitivity of the pixel may be improved.

31 Claims, 11 Drawing Sheets

CMOS IMAGE SENSOR AND METHOD OF MANUFACTURING THE SAME

CROSS-REFERENCE TO RELATED APPLICATION

This application claims priority under 35 USC §119 to Korean Patent Application No. 10-2009-0040323, filed on May 8, 2009, in the Korean Intellectual Property Office (KIPO), the entire contents of which are incorporated herein by reference.

BACKGROUND

1. Field

Example embodiments relate to a complementary metal oxide semiconductor (CMOS) image sensor and method of manufacturing the same, and more particularly, to a CMOS image sensor using a transparent oxide transistor and method of manufacturing the same.

2. Description of the Related Art

Complementary metal oxide semiconductor (CMOS) image sensors are solid state imaging devices which use the CMOS. As in charge coupled device (CCD) image sensors, the CMOS image sensor uses a photodiode. However, a manufacturing process and a method of reading signals of the CMOS image sensor and the CCD image sensor are different to each other. A CMOS image sensor, which has an amplifier in each of a plurality of unit pixels, may be mass produced using a common semiconductor manufacturing device, and thus have a lower manufacturing cost than that of a CCD image sensor.

Also, the size of a CMOS image sensor may be relatively small, and thus a CMOS image sensor has relatively low power consumption. In addition, a CMOS image sensor may be manufactured along with various signal processing devices in one chip. Because a conventional CMOS image sensor has amplifiers allocated to each pixel, noise may be generated in the CMOS image sensor due to a characteristic difference between the amplifiers. However, a signal to noise ratio (SNR) may be relatively high due to various methods of increasing the SNR.

Currently, research is being conducted into a micro process for manufacturing CMOS image sensors. When the size of a chip is reduced by applying the micro process even though the CMOS image sensor has the same number of pixels, more image sensors may be produced from one wafer. As a result, the unit cost of the image sensors may be reduced and productivity of the image sensor increases. Also, the size of a camera module including such image sensors may be reduced and thus, camera phones may be more easily miniaturized.

However, when the size of a unit pixel is reduced due to application of a micro process, realizing a high-quality CMOS image sensor may be difficult. For example, a CMOS image sensor may include a plurality of CMOS transistors and wirings for the CMOS transistors arranged on light receiving areas of the photodiodes.

SUMMARY

Example embodiments include a complementary metal oxide semiconductor (CMOS) image sensor having a structure capable of increasing an area of a photodiode in a unit pixel and expanding a light receiving area of the photodiode and a method of manufacturing the same. Additional aspects will be set forth in part in the description which follows and, in part, will be apparent from the description, or may be learned by practice of example embodiments.

According to example embodiments, a complementary metal oxide semiconductor (CMOS) image sensor may include an inter-layer dielectric (ILD) layer on a plurality of photodiodes arranged in a two-dimensional array; and an oxide semiconductor transistor layer on the ILD layer including a plurality of transistors and a plurality of wirings arranged to overlap each other along the edges of the plurality of photodiodes in a multi-layered structure.

In example embodiments, the CMOS image sensor may further include a first metal layer on the ILD layer; a first inter metal dielectric (IMD) layer on the first metal layer; the oxide semiconductor transistor layer on the first IMD layer; a second IMD layer on the oxide semiconductor transistor layer; and a second metal layer on the second IMD layer. Alternatively, the CMOS image sensor may further include a first inter metal dielectric (IMD) layer on the oxide semiconductor transistor layer; a first metal layer on the first IMD layer; a second IMD layer on the first metal layer; and a second metal layer on the second IMD layer. Alternatively, the CMOS image sensor may further include a first metal layer on the ILD layer; a first inter metal dielectric (IMD) layer on the first metal layer; a second metal layer on the first IMD layer; a second IMD layer on the second metal layer; and the oxide semiconductor transistor layer on the second IMD layer.

In example embodiments, the plurality of photodiodes may be pairs of photodiodes including a floating diffusion region between each pair of the plurality of photodiodes. The plurality of photodiodes may further include n-wells and p-type impurity regions on the n-wells. The pairs of photodiodes may further include transfer gates on surfaces between each of the plurality of photodiodes and the floating diffusion region, wherein the n-wells, the floating diffusion region, and the transfer gates form transfer transistors. In example embodiments, the plurality of transistors may include a plurality of reset transistors, a plurality of source follower transistors, and a plurality of selection transistors, each of which are transparent oxide semiconductor transistors.

In example embodiments, the CMOS image sensor may further include a plurality of output lines for outputting signals from the plurality of selection transistors, the plurality of output lines configured to connect to source regions of the plurality of selection transistors through vertically aligned first plugs. The plurality of output lines may be formed along the edges of each pair of the plurality of photodiodes and across the floating diffusion region. The plurality of source follower transistors may further include source regions configured to electrically connect to drain regions of the plurality of selection transistors and source regions of the plurality of reset transistors are configured to connect to the floating diffusion region through vertically aligned second plugs.

In example embodiments, the plurality of wirings may be formed across the plurality of photodiodes and configured to connect source regions of the plurality of reset transistors and gates of the plurality of source follower transistors. The oxide semiconductor transistor layer may further include a plurality of power source lines configured to apply an input voltage to drain regions of the plurality of reset transistors and the plurality of source follower transistors.

In example embodiments, the plurality of reset transistors and the plurality of source follower transistors may be connected to the same photodiode and receive the input voltage from different power source lines. The plurality of power source lines may be formed along the edges of each pair of the plurality of photodiodes and across the floating diffusion region, and the plurality of output lines and the plurality of power source lines are configured to overlap each other in a horizontal direction and have different heights in a vertical direction. The plurality of reset transistors may be above the floating diffusion region.

In example embodiments, the plurality of source follower transistors and the plurality of selection transistors may be arranged in a single row on opposite sides of the plurality of reset transistors and along the edges of the pairs of the photodiodes at the center in a horizontal direction. The plurality of output lines and the plurality of power source lines may be aligned perpendicular to the arrangement of the plurality of source follower transistors and the plurality of selection transistors.

In example embodiments, the CMOS image sensor may further include a plurality of selection lines configured to connect to gates of the plurality of selection transistors; a plurality of transfer lines configured to connect to the transfer gates of the plurality of transfer transistors; and a plurality of reset lines configured to connect to gates of the plurality of reset transistors. The plurality of selection lines may be configured to connect to the gates of the selection transistors through vertically aligned third plugs.

In example embodiments, the plurality of selection lines may be above the plurality of source follower transistors and the plurality of selection transistors, the plurality of selection lines, the plurality of source follower transistors and the plurality of selection transistors configured to overlap each other in a horizontal direction. The plurality of transfer lines may be connected to the transfer gates of the plurality of transfer transistors through vertically aligned fourth plugs. Two of the plurality of transfer lines may be on both sides of the plurality of reset lines, each of the plurality of transfer lines being formed across the transfer gates.

In example embodiments, the plurality of reset lines may be above the plurality of reset transistors and overlap each other in a horizontal direction, and the plurality of selection lines, the plurality of transfer lines, and the plurality of reset lines may be arranged parallel to each other. The CMOS image sensor may further include a third IMD layer, a color filter, and a micro lens sequentially formed on the second metal layer or on an exposed surface of the plurality of photodiodes.

According to example embodiments, a method of manufacturing a complementary metal oxide semiconductor (CMOS) image sensor may include forming an inter-layer dielectric (ILD) layer on a plurality of photodiodes arranged in a two-dimensional array; and forming an oxide semiconductor transistor layer on the ILD layer including a plurality of transistors and a plurality of wirings arranged to overlap each other along the edges of the plurality of photodiodes in a multi-layered structure.

In example embodiments, forming the ILD layer may include forming the plurality of photodiodes as pairs including a floating diffusion region between each pair of the plurality of photodiodes. Forming the ILD layer may include forming the plurality of photodiodes including n-wells and forming p-type impurity regions on the n-wells. Forming the pairs of photodiodes may further include forming transfer gates on surfaces between each of the plurality of photodiodes and the floating diffusion region, the n-wells, the floating diffusion region, and the transfer gates forming transfer transistors. Forming the plurality of transistors may include forming a plurality of reset transistors, a plurality of source follower transistors, and a plurality of selection transistors, each of which are transparent oxide semiconductor transistors.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
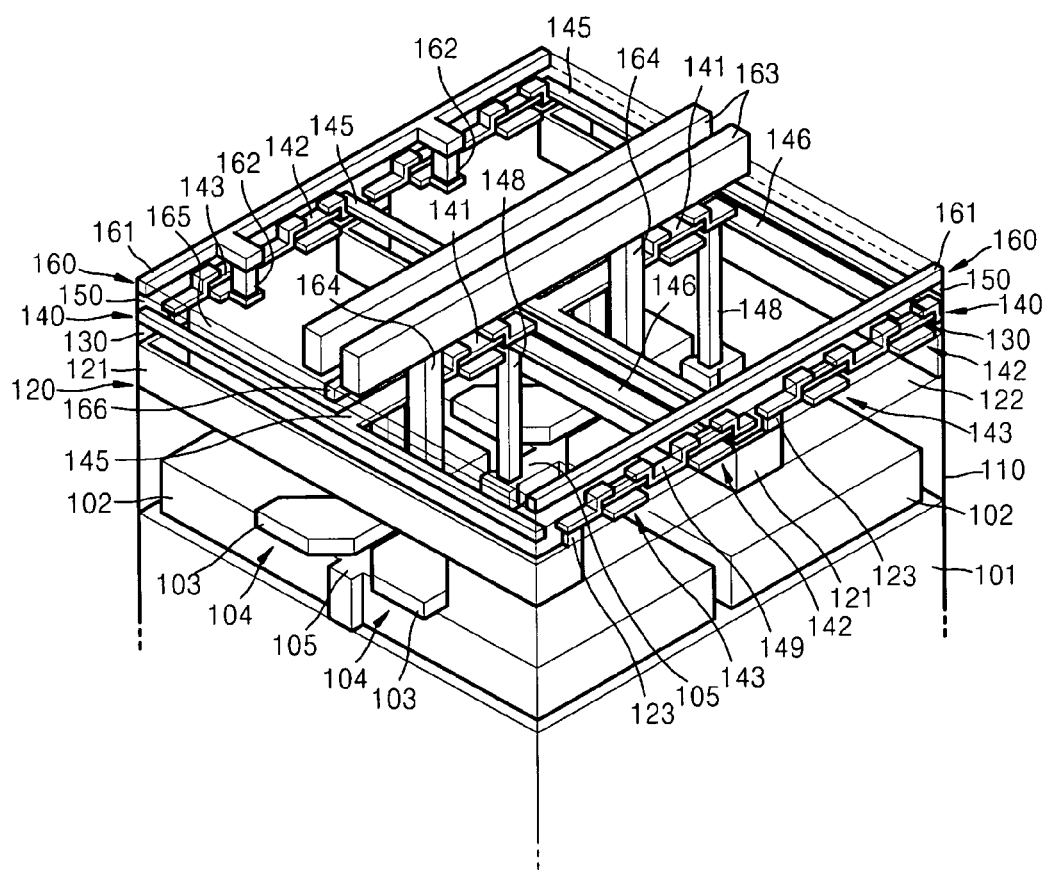
FIG. 1 is a perspective view schematically illustrating a complementary metal oxide semiconductor (CMOS) image sensor according to example embodiments.

Hereinafter, a complementary metal oxide semiconductor (CMOS) image sensor will be described in detail with reference to the accompanying drawings. In the drawings, like reference numerals denote like elements and the thicknesses of layers and regions are exaggerated for clarity. The inventive concept may, however, be embodied in many different forms and should not be construed as limited to the example embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view schematically illustrating a CMOS image sensor 100 according to example embodiments. Referring to FIG. 1, a plurality of photodiodes 102 may be arranged on a substrate 101 formed of a semiconductor material, e.g., silicon (Si). In FIG. 1, the photodiodes 102 may be illustrated in a block form. However, the photodiodes 102 actually have a layered structure for forming a PN junction. The PN junction structure of the photodiodes 102 may be based on a structure of a photodiode for a conventional CMOS image sensor, and thus, a detailed description thereof is not provided here.

Figure 4A:
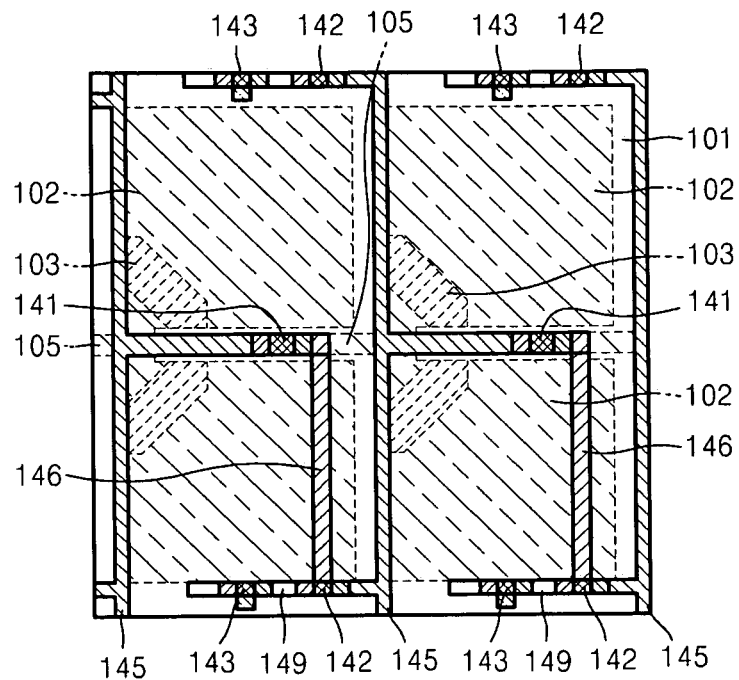
FIG. 4A is a plan view of the CMOS image sensor of FIG. 1 only illustrating an oxide semiconductor transistor layer formed on a third insulating layer.
Figure 4B:
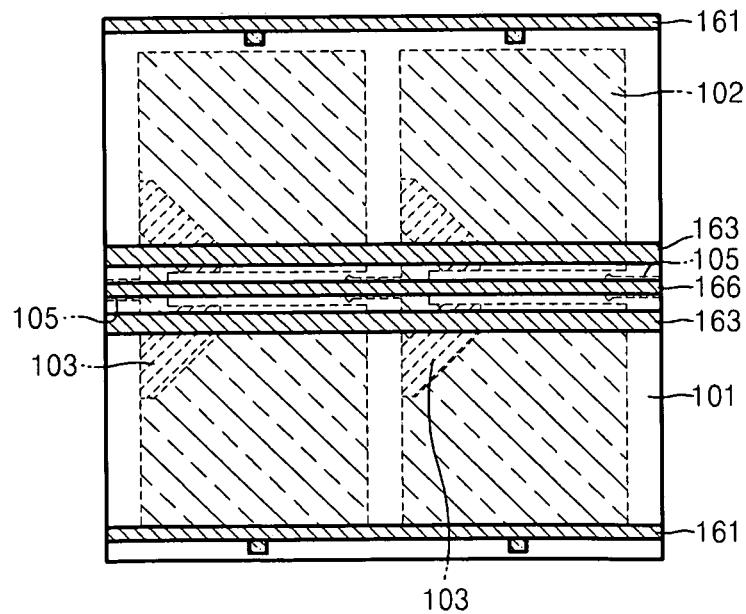
FIG. 4B is a plan view of the CMOS image sensor of FIG. 1 only illustrating arrangement of lines formed on a second metal layer.

Also, while in FIGS. 4A and 4B, four photodiodes 102 may be illustrated, a large number of photodiodes 102 actually form a two-dimensional array. One photodiode 102 may form one cell having a unique color and four photodiodes 102 may form one pixel. For example, two photodiodes 102 may form green cells in one diagonal direction and the other two photodiodes 102 may respectively form a red cell and a blue cell in another diagonal direction.

Each two photodiodes 102 constitute a pair of photodiodes and a floating diffusion region 105 may be interposed between a pair of photodiodes 102 that are adjacent to each other. The floating diffusion region 105 may be doped with an n-type impurity so as to have a lower potential than that of the photodiodes 102. In such pairs of photodiodes 102, transfer gates 103 of transfer transistors 104 may be respectively formed on the surfaces interposed between the photodiodes 102 and the floating diffusion region 105. As will be described later, the transfer transistors 104 transmit electrical signals generated from the photodiodes 102 to gates of source follower transistors 142 when a voltage may be applied to the transfer gates 103.

A first insulating layer 110 may be formed on the photodiodes 102 and the transfer transistors 104. The first insulating layer 110 may be formed of a transparent insulating material, for example, $SiO_2$.

A first metal layer 120 may be formed on the first insulating layer 110. As will be described later, output lines 121 for outputting signals from selection transistors 143 may be formed in the first metal layer 120. The output lines 121 may be formed of a metal material having improved conductivity. The output lines 121 may be also formed of a transparent conductive material, e.g., ITO, instead of the metal material. In the first metal layer 120, a second insulating layer 122 may be filled in a gap between the output lines 121. A third insulating layer 130 may be formed on the first metal layer 120. As in the first insulating layer 110, the second insulating layer 122 and the third insulating layer 130 may be formed of a transparent insulating material, for example, $SiO_2$.

An oxide semiconductor transistor layer 140 may be formed on the third insulating layer 130. An oxide semiconductor transistor may be a transistor which has an oxide semiconductor between a gate insulating film and a source/drain region and may be transparent. The oxide semiconductor transistor layer 140 may include a plurality of reset transistors 141, the source follower transistors 142, and the selection transistors 143. These transistors 141 through 143 may be oxide semiconductor transistors. As illustrated in FIG. 1, source regions of the source follower transistors 142 and drain regions of the selection transistors 143 may be electrically connected to each other by wirings 149. For example, source electrodes of the source follower transistors 142, drain electrodes of the selection transistors 143, and the wirings 149 may be formed of one transparent conductive material, for example, ITO. The source regions of the selection transistors 143 may be connected to the output lines 121 through first plugs 123 formed by vertically penetrating the third insulating layer 130. Also, sources of the reset transistors 141 may be connected to the floating diffusion region 105 through second plugs 148 formed by vertically penetrating the first through third insulating layers 110, 122, and 133.

In addition, the oxide semiconductor transistor layer 140 may further include power source lines 145 and wirings 146, wherein the power source lines 145 apply an input voltage Vdd to the reset transistors 141 and the source follower transistors 142 and the wirings 146 connect the gap between the source regions of the reset transistors 141 and the gates of the source follower transistors 142. The power source lines 145 and the wirings 146 may be formed of a metal material having improved conductivity. The power source lines 145 and the wirings 146 may be also formed of a transparent conductive material, e.g., ITO, instead of the metal material. In addition, although not properly illustrated in FIG. 1, a fourth insulating layer 147 (refer to FIG. 5A) may be filled in a gap between the transistors 141 through 143, the power source lines 145, and the wirings 146. The fourth insulating layer 147 may be also formed of a transparent insulating material, e.g., $SiO_2$.

A fifth insulating layer 150 may be further formed on the oxide semiconductor transistor layer 140. Also, a second metal layer 160 may be formed on the fifth insulating layer 150. The second metal layer 160 may include selection lines 161, transfer lines 163, and reset lines 166, wherein the selection lines 161 may be connected to gates of the selection transistors 143, the transfer lines 163 may be connected to the transfer gates 103 of the transfer transistors 104, and the reset lines 166 may be connected to gates of the reset transistors 141. The selection lines 161 may be connected to the gates of the selection transistors 143 through third plugs 162 formed by vertically penetrating the fifth insulating layer 150. Also, the transfer lines 163 may be connected to the transfer gates 103 of the transfer transistors 104 through fourth plugs 164 formed by vertically penetrating the first through fifth insulating layers 110, 122, 130, 147, and 150.

Accordingly, while a voltage is applied to the transfer lines 163, the transfer transistors 104 may be turned on and electrical signals generated from the photodiodes 102 are transmitted to the gates of the source follower transistors 142. In addition, while a voltage is applied to the selection lines 161, the selection transistors 143 may be turned on and signals from the source follower transistors 142 may be finally output through the output lines 121. The reset lines 166 may be connected to the gates of the reset transistors 141 through fifth plugs (not illustrated) formed by vertically penetrating the fifth insulating layer 150. When the reset transistors 141 are turned on through the reset lines 166, a current which flows to the gates of the source follower transistors 142 may be initialized.

The selection lines 161, the transfer lines 163, and the reset lines 166 may be formed of a metal material having improved conductivity. The selection lines 161, the transfer lines 163, and the reset lines 166 may be also formed of a transparent conductive material, e.g., ITO, instead of the metal material. The selection lines 161, the transfer lines 163, and the reset lines 166 may be formed to have the same height on the same plane but may be formed to have different heights. For example, the transfer lines 163 may be formed to be higher than the selection lines 161 and the reset lines 166. A sixth insulating layer 165 may be filled in a gap between the selection lines 161, the transfer lines 163, and the reset lines 166. As in the other insulating layers described above, the fifth insulating layer 150 and the sixth insulating layer 165 may be also formed of a transparent insulating material, e.g., $SiO_2$.

Figure 2A:
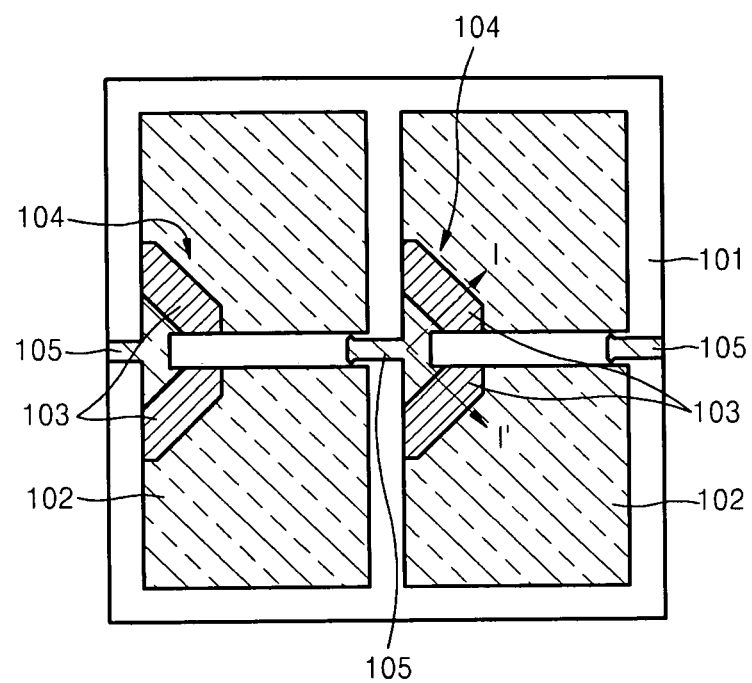
FIG. 2A is a plan view only illustrating photodiodes and transfer transistors formed on a substrate of the CMOS image sensor illustrated in FIG. 1.
Figure 2B:
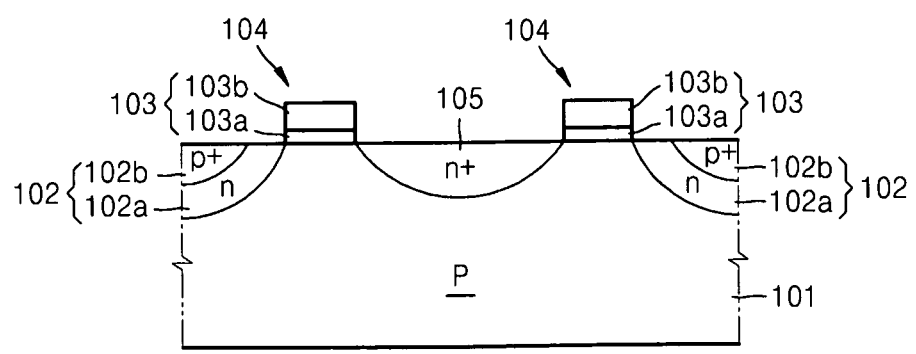
FIG. 2B is a cross sectional view of the CMOS image sensor of FIG. 1 cut along the line I-I of FIG. 2A.

Hereinafter, each element of the CMOS image sensor 100 will be described in more detail with reference to plan views and cross sectional views. FIG. 2A is a plan view only illustrating the photodiodes 102 and transfer transistors 104 formed on the substrate 101 of the CMOS image sensor 100 illustrated in FIG. 1 and FIG. 2B is a cross sectional view of the CMOS image sensor 100 of FIG. 1 cut along a line I-I of FIG. 2A. Referring to FIG. 2A, the plurality of photodiodes 102 formed on the substrate 101 form a two-dimensional array. The floating diffusion region 105 may be connected between two photodiodes 102. Accordingly, two photodiodes 102 and one floating diffusion region 105 interposed between the two photodiodes 102 may be formed as one block. In addition, the transfer gates 103 of the transfer transistors 104 may be formed on the surfaces between the photodiodes 102 and the floating diffusion region 105.

Referring to FIG. 2B, n-wells 102A may be formed in, for example, the p-type silicon substrate 101 and p-type impurity regions 102B may be formed on the n-wells 102A. The n-wells 102A and the p-type impurity regions 102B form the photodiodes 102 having a PN junction structure. The floating diffusion region 105 doped with an n-type impurity, and which is disposed between the two photodiodes 102, is spaced apart from the two photodiodes 102 by a certain interval. Also, the transfer gates 103 respectively formed of gate insulating layers 103A and gate electrodes 103B may be formed on the surfaces of the p-type silicon substrate 101 respectively interposed between the photodiodes 102 and the floating diffusion region 105. The gate insulating layers 103A may be formed of an insulating material, for example, $SiO_2$ and the gate electrodes 103B may be formed of, for example, poly-crystalline Silicon poly-Si.

In such a structure, the n-wells 120A of the photodiodes 102, the floating diffusion region 105, and the transfer gates 103 form the transfer transistors 104. Accordingly, as illustrated in FIG. 2B, the transfer transistors 104 may be respectively assigned to the photodiodes 102 and two transfer transistors 104 disposed on two adjacent photodiodes 102 share one floating diffusion region 105. The two transfer transistors 104 disposed on two adjacent photodiodes 102 may not be turned on simultaneously. When the transfer transistors 104 on the left side in FIG. 2B are turned on, electrical signals generated from the photodiodes 102 on the left side may be transmitted to the gates of the source follower transistors 142 through the floating diffusion region 105. Also, when the transfer transistors 104 on the right side in FIG. 2B are turned on, electrical signals generated from the photodiodes 102 on the right side may be transmitted to the gates of the source follower transistors 142 through the floating diffusion region 105.

Figure 3:
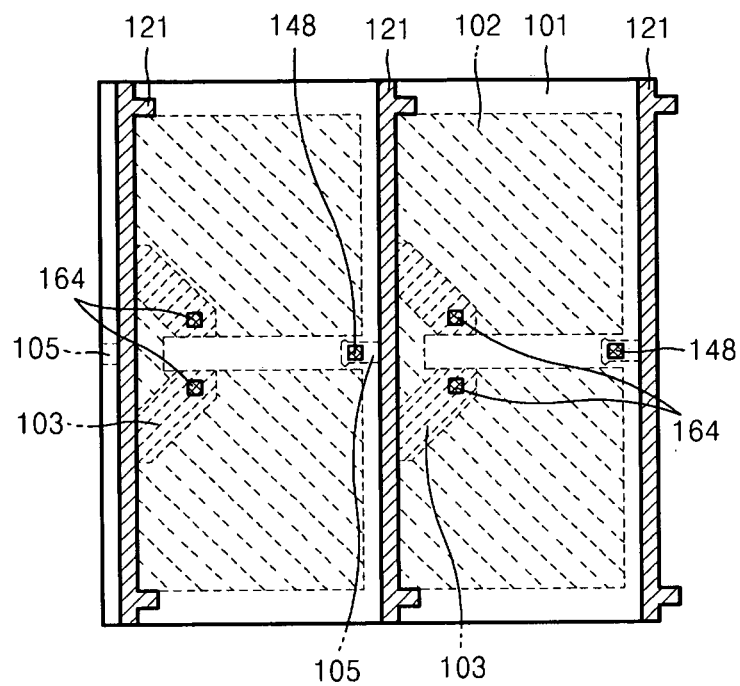
FIG. 3 is a cross sectional view of the CMOS image sensor of FIG. 1 cut along a portion of a first metal layer, on which output lines are formed, in a transverse direction.

FIG. 3 is a cross sectional view of the CMOS image sensor 100 of FIG. 1 cut along a portion of the first metal layer 120, on which the output lines 121 may be formed, in a transverse direction. In FIG. 3, the photodiodes 102 and the floating diffusion region 105 are illustrated with dotted lines in order to show relative locations of the photodiodes 102 and the floating diffusion region 105. Referring to FIG. 3, the output lines 121 for outputting signals generated from the selection transistors 143 may be formed in a first direction (for example, a longitudinal direction in FIG. 3) along the edges of the two adjacent photodiodes 102 and across the floating diffusion region 105. Fourth plugs 164 may be formed vertically on the transfer gates 103 so as to connect the transfer gates 103 with the transfer lines 163 (see FIG. 1). In addition, the second plugs 148 may be formed vertically on the floating diffusion region 105 so as to connect the floating diffusion region 105 with the sources of the reset transistors 141.

FIG. 4A is a plan view of the CMOS image sensor 100 of FIG. 1 only illustrating the oxide semiconductor transistor layer 140 formed on the third insulating layer 130. In FIG. 4A, the photodiodes 102 and the floating diffusion region 105 are illustrated with dotted lines in order to show relative locations of the photodiodes 102 and the floating diffusion region 105. Referring to FIG. 4A, the power source lines 145 for applying the input voltage Vdd to the reset transistors 141 and the source follower transistors 142 may be formed in the first direction along the edges of the two adjacent photodiodes 102 and across the floating diffusion region 105. Accordingly, the output lines 121 and the power source lines 145 may be disposed to overlap each other while viewed from a horizontal direction and only have different heights while viewed from a vertical direction.

In addition, the reset transistors 141 may be disposed above the floating diffusion region 105 interposed between two adjacent photodiodes 102. Moreover, the source follower transistors 142 and the selection transistors 143 may be respectively arranged in a single row on the opposite sides of the reset transistors 141 based on the photodiodes 102 at the center in a second direction (that is, a lateral direction in FIG. 4A) perpendicular to the first direction along the edges of the two adjacent photodiodes 102. Accordingly, the directions of the output lines 121 and the power source lines 145 may be perpendicular to the arrangement of the source follower transistors 142 and the selection transistors 143. The source follower transistors 142 and the selection transistors 143 may be connected in a straight line through the wirings 149. In addition, the wirings 146 connecting the source regions of the reset transistors 141 and the gates of the source follower transistors 142 may further be formed across the photodiodes 102 in the first direction.

According to example embodiments, the power source lines 145 may be respectively connected to the reset transistors 141 on the right side thereof and the source follower transistors 142 on the left side thereof, as in FIG. 4A. That is, the reset transistors 141 and the source follower transistors 142 receiving the input voltage Vdd from one same power source line 145 may be disposed to be opposite each other based on the power source line 145 at the center. Accordingly, the reset transistors 141 and the source follower transistors 142 which are related to the same photodiodes 102 respectively receive the input voltage Vdd from the power source lines 145, that are adjacent to and different from each other, instead of from the same power source line 145.

FIG. 4B is a plan view of the CMOS image sensor 100 of FIG. 1 only illustrating arrangement of the selection lines 161, the transfer lines 163, and the reset lines 166 formed in the second metal layer 160. In FIG. 4B, the photodiodes 102 and the floating diffusion region 105 are illustrated with dotted lines in order to show relative locations of the photodiodes 102 and the floating diffusion region 105. Referring to FIG. 4B, the transfer lines 163 connected to the transfer gates 103 of the transfer transistors 104 may be disposed across the transfer gates 103 in the second direction (that is, a lateral direction of FIG. 4B) perpendicular to the first direction. In FIG. 4B, two transfer lines 163 may be formed on both sides of the reset lines 166, wherein each of the transfer lines 163 may be connected to the transfer gates 103 through the fourth plugs 164 illustrated in FIGS. 1 and 3. The transfer gates 103 of two transfer transistors 104, which share the floating diffusion region 105, may be respectively connected to different transfer lines 163. Accordingly, the two transfer transistors 104, which share the floating diffusion region 105, may be each independently turned on and off.

The reset lines 166 may be arranged above the floating diffusion region 105 interposed between two adjacent photodiodes 102 in the second direction. The selection lines 161 may be respectively arranged on the opposite sides of the reset lines 166 based on the photodiodes 102 at the center in the second direction along the edges of the photodiodes 102. Accordingly, the selection lines 161, the transfer lines 163, and the reset lines 166 may be arranged parallel to each other. Also, the reset lines 166 and the reset transistors 141 below the reset lines 166 may be disposed to overlap each other while viewed from a horizontal direction. In addition, the selection lines 161 (and the source follower transistors 142 and the selection transistors 143 that are below the selection lines 161) are disposed to overlap each other while viewed from a horizontal direction.

Figure 5A:
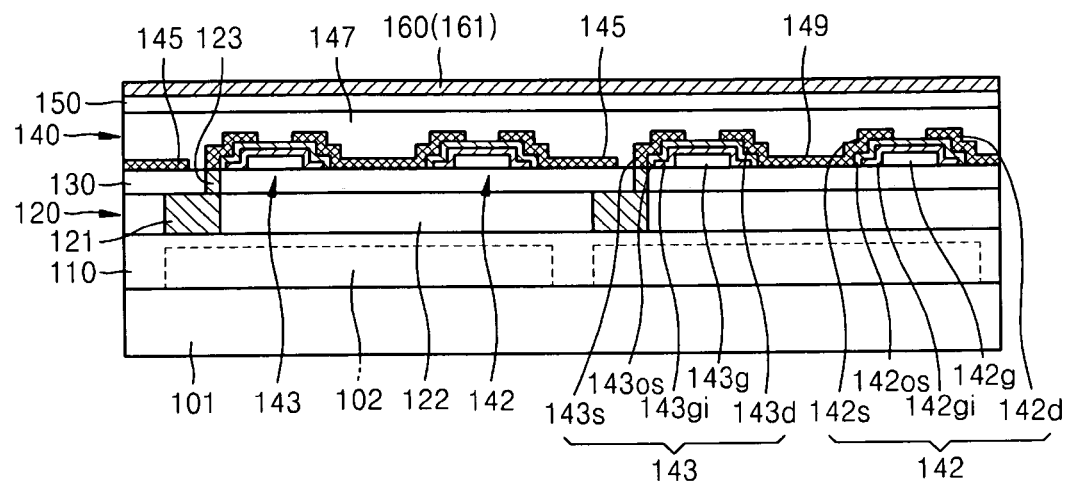
FIG. 5A is a cross sectional view of the CMOS image sensor of FIG. 1 cut along a portion, on which source follower transistors and selection transistors are formed, vertically in a second direction.

FIG. 5A is a cross sectional view of the CMOS image sensor 100 of FIG. 1 cut along a portion, on which the source follower transistors 142 and the selection transistors 143 are formed, vertically in the second direction. In FIG. 5A, the photodiodes 102 are illustrated with dotted lines in order to show a relative location of the photodiodes 102. Referring to FIG. 5A, the photodiodes 102 may be formed on the substrate 101 and the first insulating layer 110 covers the photodiodes 102. The first metal layer 120 may be formed on the first insulating layer 110. The output lines 121 for outputting signals generated from the selection transistors 143 and the second insulating layer 122 may be formed in the first metal layer 120. The third insulating layer 130 may be formed on the first metal layer 120. The first plugs 123 may be formed by vertically penetrating the third insulating layer 130 and connecting the output lines 121 disposed below the first plugs 123 with the selection transistors 143 disposed above the first plugs 123.

The oxide semiconductor transistor layer 140 may be formed on the third insulating layer 130. The power source lines 145, the source follower transistors 142, and the selection transistors 143 may be formed in the oxide semiconductor transistor layer 140. The source follower transistors 142 and the selection transistors 143 may be transparent oxide semiconductor transistors having a bottom gate structure in which gates thereof may be disposed at the bottom.

For example, as illustrated in FIG. 5A, the source follower transistors 142 may include gate electrodes 142G, gate insulating layers 142GI, oxide semiconductor layers 142OS, source regions 142S, and drain regions 142D, wherein the gate electrodes 142G may be formed on the third insulating layer 130, the gate insulating layers 142GI cover the gate electrodes 142G, the oxide semiconductor layers 142OS cover the gate insulating layers 142GI, and the source regions 142S and the drain regions 142D may be respectively formed on both sides of the oxide semiconductor layers 142OS. For example, the gate electrodes 142G, the source regions 142S, and the drain regions 142D may be formed of a transparent conductor, e.g., ITO. The gate insulating layers 142GI may be formed of a transparent insulating material such as $SiO_2$. The oxide semiconductor layers 142OS may be formed of a transparent oxide, for example, ZnO, SnO, or InO, or a material further including Ta, Hf, In, Ga, or Sr in addition to those oxides.

As in the source follower transistors 142, the selection transistors 143 may include gate electrodes 143G, gate insulating layers 143GI, oxide semiconductor layers 143OS, source regions 143S, and drain regions 143D, wherein the gate electrodes 143G may be formed on the third insulating layer 130, the gate insulating layers 143GI cover the gate electrodes 143G, the oxide semiconductor layers 143OS cover the gate insulating layers 143GI, and the source regions 143S and the drain regions 143D may be respectively formed on both sides of the oxide semiconductor layers 143OS. The selection transistors 143 may be formed of the same material for forming the source follower transistors 142. As described above, the source regions 143S of the selection transistors 143 may be connected to the output lines 121 through the first plugs 123. The drain regions 143D of the selection transistors 143 may be connected to the source regions 142S of the source follower transistors 142 through the wirings 149. Thus, the drain regions 143D of the selection transistors 143, the wirings 149, and the source regions 142S of the source follower transistors 142 may be formed of the same material (for example, ITO) in a single body. In addition, the drain regions 142D of the source follower transistors 142 may be connected to the power source lines 145.

The source follower transistors 142, the selection transistors 143, the power source lines 145, and the wirings 149 formed in the oxide semiconductor transistor layer 140 may be covered by the fourth insulating layer 147. The fifth insulating layer 150 and the second metal layer 160 may be sequentially formed on the oxide semiconductor transistor layer 140. The selection lines 161 connected to the gates of the selection transistors 143 may be formed in the second metal layer 160. The selection lines 161 may be electrically connected to the gate electrodes 143G of the selection transistors 143 through the third plugs 162 illustrated in FIG. 1. Although not clearly illustrated in FIG. 5A, other elements in the second metal layer 160 may be surrounded by the sixth insulating layer 165.

Figure 5B:
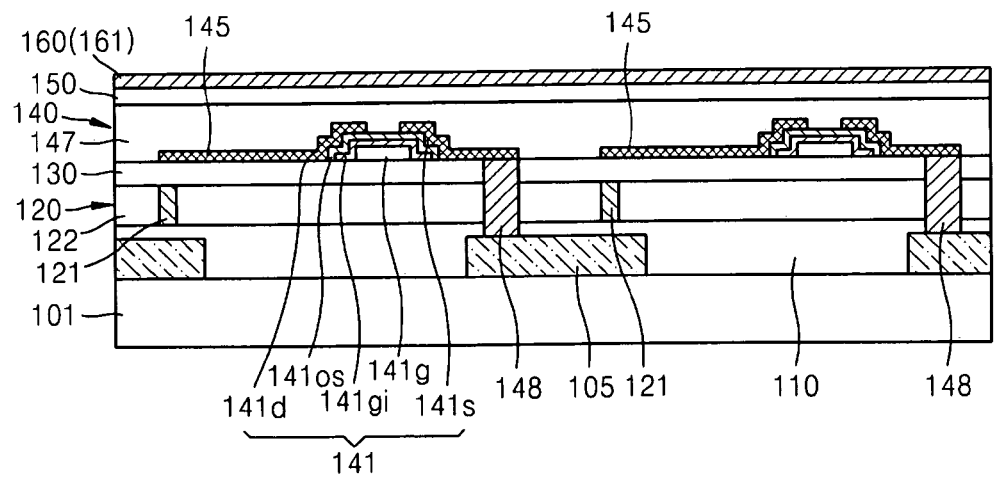
FIG. 5B is a cross sectional view of the CMOS image sensor of FIG. 1 cut along a portion, on which reset transistors are formed, vertically in a second direction.

FIG. 5B is a cross sectional view of the CMOS image sensor 100 of FIG. 1 cut along a portion, on which reset transistors 141 are formed, vertically in the second direction. Referring to FIG. 5B, the floating diffusion region 105 interposed between two adjacent photodiodes 102 may be formed on the substrate 101 and the first insulating layer 110 may be formed on the substrate 101 to cover the floating diffusion region 105. The first metal layer 120 may be formed on the first insulating layer 110. The output lines 121 and the second insulating layer 122 may be formed in the first metal layer 120. The third insulating layer 130 may be formed on the first metal layer 120 and the oxide semiconductor transistor layer 140 may be formed on the third insulating layer 130.

In FIG. 5B, the power source lines 145 and the reset transistors 141 may be formed in the oxide semiconductor transistor layer 140. The reset transistors 141 may be transparent oxide semiconductor transistor having a bottom gate structure, in which gates thereof may be disposed at the bottom. The structure and forming material of the reset transistors 141 may be the same as those of the source follower transistors 142 and the selection transistors 143. For example, as illustrated in FIG. 5B, the reset transistors 141 may include gate electrodes 141G, gate insulating layers 141GI, oxide semiconductor layers 141OS, source regions 141S, and drain regions 141D, wherein the gate electrodes 141G may be formed on the third insulating layer 130, the gate insulating layers 141GI cover the gate electrodes 141G, the oxide semiconductor layers 141OS cover the gate insulating layers 141GI, and the source regions 141S and the drain regions 141D may be respectively formed on both sides of the oxide semiconductor layers 141OS. The drain regions 141D of the reset transistors 141 may be connected to the power source lines 145. The source regions 141S of the reset transistors 141 may be connected to the floating diffusion region 105 through the second plugs 148 formed by vertically penetrating the first through third insulating layers 110, 122, and 130. Also, the source regions 141S may be connected to the gates of the source follower transistors 142, for example, the gate electrodes 142G, through the wirings 146 illustrated in FIGS. 1 and 4A.

The fifth insulating layer 150 and the second metal layer 160 may be sequentially formed on the oxide semiconductor transistor layer 140. In FIG. 5B, the reset lines 166 connected to the gates of the reset transistors 141 may be formed in the second metal layer 160. For example, the reset lines 166 may be electrically connected to the gate electrodes 141G of the reset transistors 141 through fifth plugs (not illustrated) formed by vertically penetrating the fifth insulating layer 150. As illustrated in FIG. 1, other elements in the second metal layer 160 may be surrounded by the sixth insulating layer 165.

Figure 6:
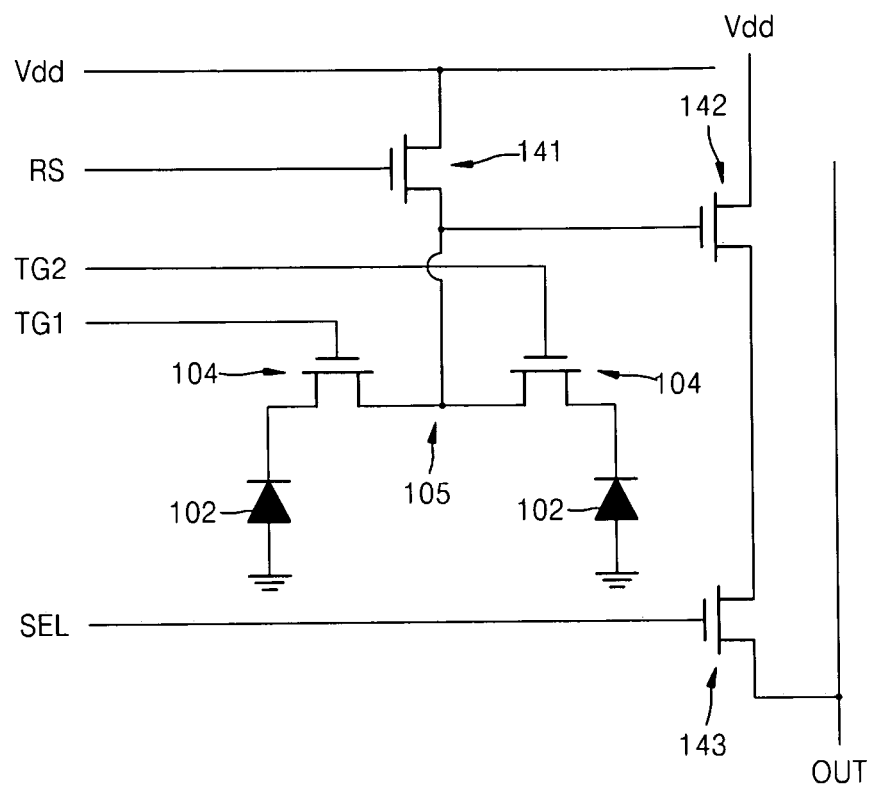
FIG. 6 is an equivalent circuit diagram schematically illustrating a circuit structure of the CMOS image sensor of FIG. 1.

As described above, two transfer transistors 104, and one reset transistor 141, one source follower transistor 142, and one selection transistor 143 may be allocated to two adjacent photodiodes 102 in the CMOS image sensor 100. FIG. 6 is an equivalent circuit diagram schematically illustrating a circuit structure of the CMOS image sensor 100 of FIG. 1. In FIG. 6, TG1 and TG2 denote the transfer lines 163, RS denotes the reset line 166, SEL denotes the selection line 161, and OUT denotes the output line 121. The source regions of the two transfer transistors 104 may be respectively connected to corresponding photodiodes 102. The floating diffusion region 105 shared by the two transfer transistors 104 functions as a drain region. The source region of the reset transistor 141 may be simultaneously connected to the floating diffusion region 105 and the gate of the source follower transistors 142. The input voltage Vdd may be applied to the drains of the reset transistors 141 and source follower transistors 142 through separate power source lines 145. The output of the source follower transistors 142 may be finally provided to the output lines 121 through the selection transistors 143.

In such a structure, in order to read the signal generated from any one of the photodiodes 102, the selection transistors 143 may be turned on through the selection lines 161. The signal from the source follower transistors 142 may be provided to the output lines 121. The amplitude of the signals transmitted from the drain regions of the source follower transistors 142 to the output lines 121 through the selection transistors 143 may vary according to the voltage applied to the gates of the source follower transistors 142. While the selection transistors 143 are turned on, the reset transistors 141 may be turned on through the reset lines 166, and thus, an electric potential of the floating diffusion region 105 may be initialized. The reset transistors 141 may be turned off and the transfer transistors 104 connected to the photodiodes 102, which are to read the signals, may be turned on. Two transfer transistors 104, which share the floating diffusion region 105, may not be simultaneously turned on. While either of the transfer transistors 104 is turned on, the other transfer transistor 104 may be turned off.

Figure 7:
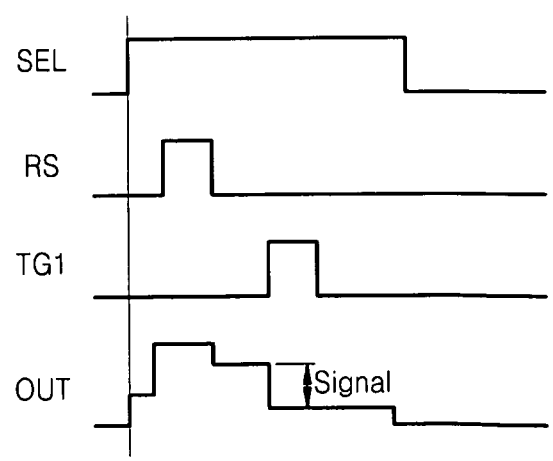
FIG. 7 is a timing diagram schematically illustrating an operation of the CMOS image sensor of FIG. 1.

When the transfer transistors 104 are turned on, the signals generated from the photodiodes 102 may be transmitted to the floating diffusion region 105 through the transfer transistors 104. Accordingly, the electric potential of the initialized floating diffusion region 105 may be changed, and thus, the electric potential applied to the gates of the source follower transistors 142 may be changed. As a result, the amplitude of the signals transmitted from the source follower transistors 142 to the output lines 121 through the selection transistors 143 may be changed. The difference in the amplitude of the signals may represent quantity of light provided to the photodiodes 102. That is, the electrical signals generated from the photodiodes 102 may be used to control an output amount of the source follower transistors 142. Thus, when sufficient input voltage Vdd is applied to the drain regions of the source follower transistors 142, large output change may be obtained although the electrical signals generated from the photodiodes 102 is relatively small. In this regard, the source follower transistors 142 may function as an amplifier. Such an operation of the CMOS image sensor 100 may be understood more easily through a timing diagram of FIG. 7.

Figure 8:
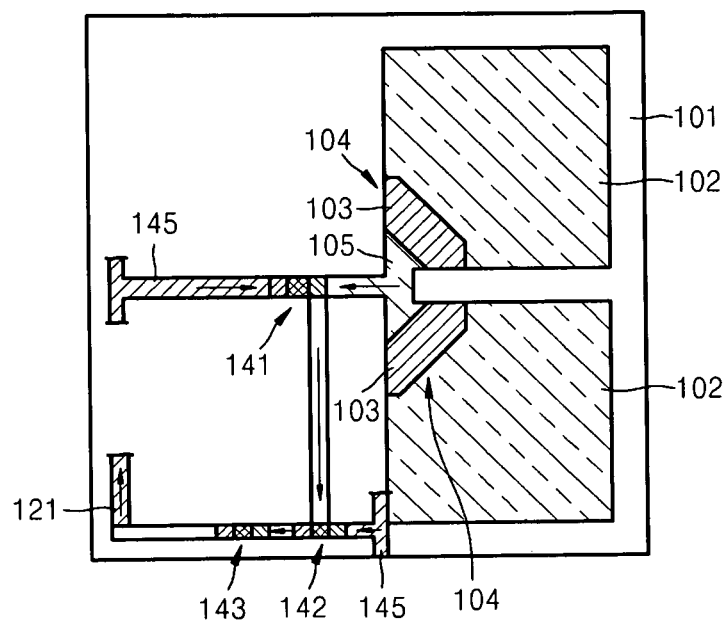
FIG. 8 is a plan view of the CMOS image sensor of FIG. 1 only illustrating two photodiodes, which share a floating diffusion region, and transistors and wirings that are directly related to the photodiodes.

FIG. 8 is a plan view of the CMOS image sensor 100 of FIG. 1 only illustrating the two photodiodes 102, which share the floating diffusion region 105, and the transistors 104, 141, 142, 143 and wirings 121 and 145 that are directly related to the photodiodes 102. Referring to FIG. 8, the transistors 141, 142, and 143 from among the plurality of transistors 104, 141, 142, 143 arranged to read the signals from the photodiodes 102 may not be disposed in the upper region of the photodiodes 102. Accordingly, the transistors 141, 142, and 143 arranged directly above any one of the photodiodes 102 may read the signals of other photodiodes adjacent to the photodiodes 102 in the second direction.

In FIG. 8, signal flow is denoted with arrows. As shown by the arrows, the input voltage may be respectively applied to the drains of the reset transistors 141 and the source follower transistors 142 through separate power source lines 145. The signal may be transmitted to the output lines 121 from the source follower transistors 142 through the selection transistors 143. The amplitude of the signal may be determined by the electrical potential of the floating diffusion region 105 connected to the gates of the source follower transistors 142.

In the CMOS image sensor 100, the plurality of transistors 141, 142, and 143 used to read the signals from the photodiodes 102 and the plurality of wirings 121, 145, 146, 149, 161, and 163 may be arranged to overlap each other along the edges of the photodiodes 102 in a multi-layered structure. As a result, a relative area of the photodiodes 102 with respect to the same unit pixel area may be greater than that of a conventional CMOS image sensor. Accordingly, a size of a unit pixel may be decreased without a reduction in sensitivity and a higher quality CMOS image sensor may be provided. In addition, because the plurality of transistors 141, 142, and 143 and the plurality of wirings 121, 145, 146, 149, 161, and 163 are transparent, the blocking of light incident on the photodiodes 102 by the plurality of transistors 141, 142, and 143 and the plurality of wirings 121, 145, 146, 149, 161, and 163 may be minimized or reduced.

Figure 9A:
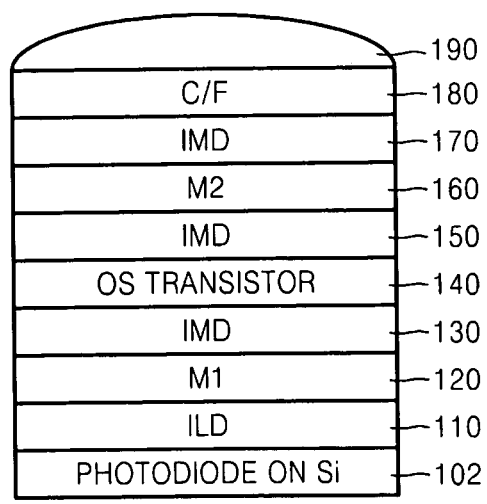
FIGS. 9A through 9C schematically illustrate CMOS image sensors further including a color filter and a micro lens.
Figure 9B:
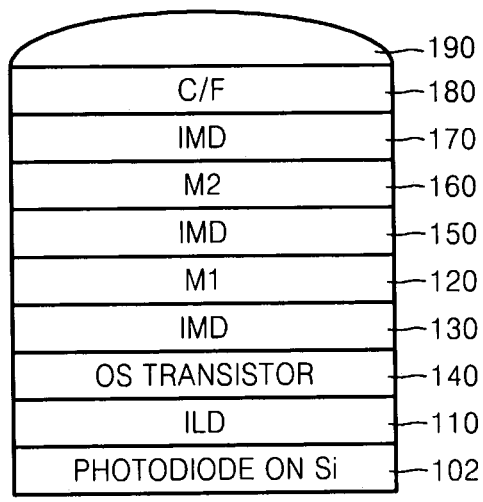
Figure 9C:
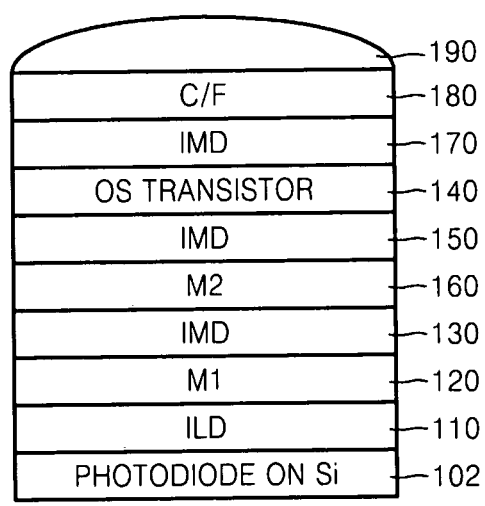

In addition, the CMOS image sensor 100 may further include a color filter and a micro lens formed on the unit pixel structure described above. FIGS. 9A through 9C schematically illustrate CMOS image sensors further including a color filter 180 and a micro lens 190. Referring to FIG. 9A, the first insulating layer 110 constituting an inter-layer dielectric (ILD) layer, the first metal layer 120, the third insulating layer 130 constituting a first inter metal dielectric (IMD) layer, the oxide semiconductor transistor layer 140, the fifth insulating layer 150 constituting a second IMD layer, and the second metal layer 160 may be sequentially formed on the photodiode 102 disposed on the silicon substrate 101. The structure of the layers may be described above in more detail. A seventh insulating layer 170 constituting a third IMD, the color filter 180, and the micro lens 190 may be further formed on the second metal layer 160. Although not illustrated, an adhesive layer for fixing the micro lens 190 may be interposed between the color filter 180 and the micro lens 190.

In FIG. 9A, the oxide semiconductor transistor layer 140 may be interposed between two metal layers 120 and 160. However, locations of the two metal layers 120 and 160 and the oxide semiconductor transistor layer 140 may be changed according to example embodiments. For example, referring to FIG. 9B, the oxide semiconductor transistor layer 140 may be formed on the first insulating layer 110, the first metal layer 120 may be formed on the third insulating layer 130, and the second metal layer 160 may be formed on the fifth insulating layer 150. In example embodiments, each layer may have the structure described above. Locations or lengths of the plugs vertically penetrating the insulating layers and connecting with the transistors or wirings disposed above and below are only slightly changed. Also, as in FIG. 9C, the first metal layer 120 may be formed on the first insulating layer 110, the second metal layer 160 may be formed on the third insulating layer 130, and the oxide semiconductor transistor layer 140 may be formed on the fifth insulating layer 150.

Figure 10A:
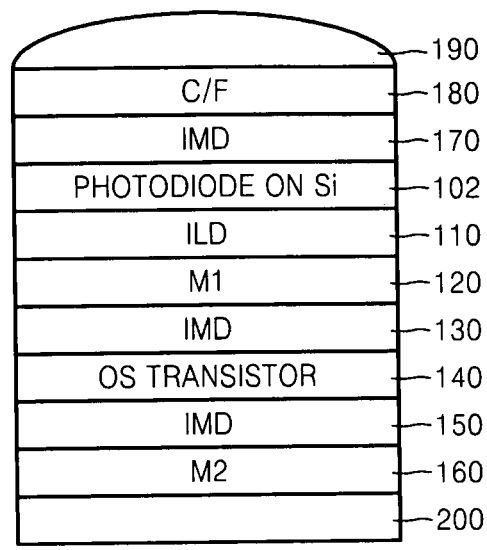
FIGS. 10A through 10C schematically illustrate CMOS image sensors in which locations of the color filter and the micro lens are changed.
Figure 10B:
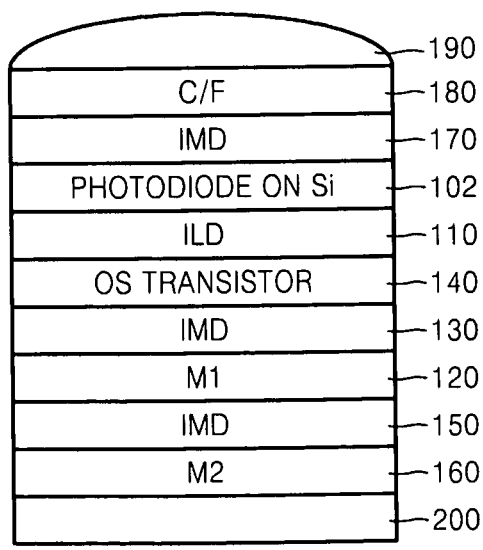
Figure 10C:
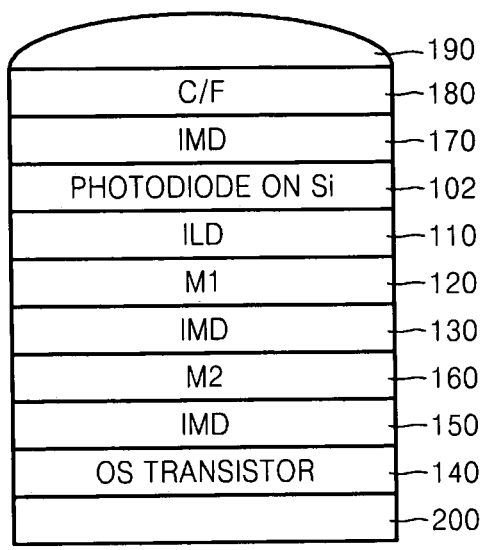

FIGS. 10A through 10C schematically illustrate CMOS image sensors in which locations of the color filter 180 and the micro lens 190 are changed. Referring to FIG. 10A, the color filter 180 and micro lens 190 may be formed on a surface of the photodiode 102 opposite to that on which the other elements illustrated in FIG. 9A are disposed. That is, in FIG. 9A, the first insulating layer 110, the first metal layer 120, the third insulating layer 130, the oxide semiconductor transistor layer 140, the fifth insulating layer 150, and the second metal layer 160 may be sequentially formed on the photodiode 102. The seventh insulating layer 170, the color filter 180, and the micro lens 190 may be sequentially formed on the second metal layer 160. However, in FIG. 10A, the first insulating layer 110, the first metal layer 120, the third insulating layer 130, the oxide semiconductor transistor layer 140, the fifth insulating layer 150, and the second metal layer 160 may be sequentially formed on the photodiode 102. The photodiode 102 may be turned over, the second metal layer may be connected to a support plate 200, and the seventh insulating layer 170, the color filter 180, and the micro lens 190 may be sequentially formed on the surface of the photodiode 102 that is opposite to the surface where the first insulating layer 110, the first metal layer 120, the third insulating layer 130, the oxide semiconductor transistor layer 140, the fifth insulating layer 150, and the second metal layer 160 may be formed.

Figure 11A:
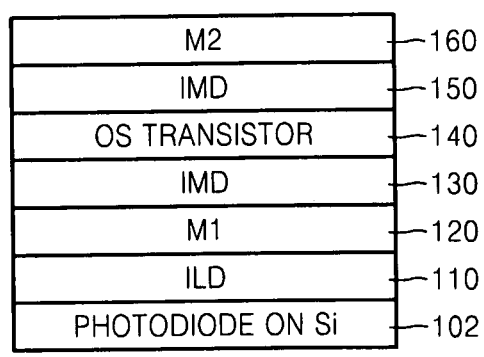
FIGS. 11A through 11C are schematic diagrams for illustrating a method of manufacturing of the CMOS image sensor of FIG. 10A.
Figure 11B:
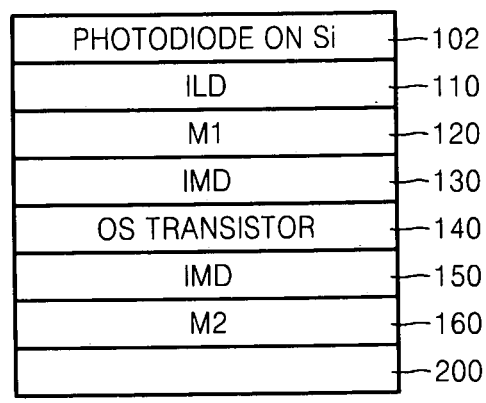
Figure 11C:
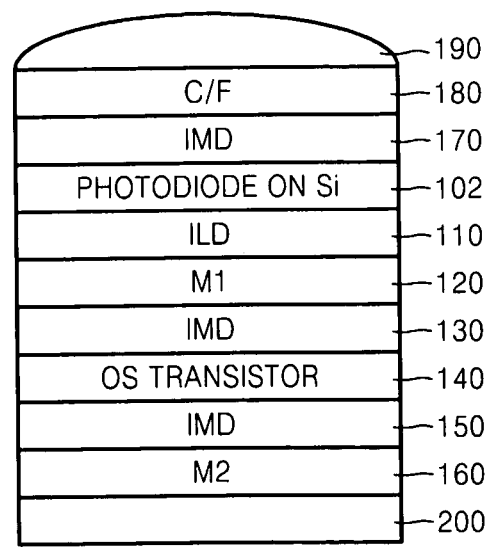

FIGS. 11A through 11C are schematic diagrams for illustrating a method of manufacturing of the CMOS image sensor of FIG. 10A. Referring to FIG. 11A, the first insulating layer 110, the first metal layer 120, the third insulating layer 130, the oxide semiconductor transistor layer 140, the fifth insulating layer 150, and the second metal layer 160 may be sequentially formed on the photodiode 102. Referring to FIG. 11B, the structure of FIG. 11A may be turned over and the second metal layer 160 may be connected to a support plate 200.

The substrate 101 (shown in FIG. 1) formed on the photodiode 102 may be removed using, for example, chemical mechanical planarization (CMP), and thus, the photodiode 102 may be exposed. Instead, in a step of FIG. 11A, the substrate 101 formed on a lower surface of the photodiode 102 may be partially removed in advance and in a next step of FIG. 11B, the remaining part of the substrate 101 may be removed. Referring to FIG. 11C, the seventh insulating layer 170, the color filter 180, and the micro lens 190 may be sequentially formed on the exposed photodiode 102.

The photodiode 102 may receive light without being disturbed by the wirings and transistors included in the first metal layer 120, the second metal layer 160, and the oxide semiconductor transistor layer 140. Accordingly, a light receiving area and sensitivity of the photodiode 102 may be improved.

FIGS. 10B and 10C schematically illustrate CMOS image sensors in which locations of the first metal layer 120, the second metal layer 160, and the oxide semiconductor transistor layer 140 may be changed. For example, FIG. 10B corresponds to FIG. 9B and FIG. 10C corresponds to FIG. 9C. As described with reference to FIGS. 9B and 9C, the structure and performance of the CMOS image sensors illustrated in FIGS. 10B and 10C may not be changed.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A complementary metal oxide semiconductor (CMOS) image sensor comprising:
an inter-layer dielectric (ILD) layer on a plurality of photodiodes arranged in a two-dimensional array; and
an oxide semiconductor transistor layer on the ILD layer including a plurality of transistors and a plurality of wirings arranged to overlap each other along the edges of the plurality of photodiodes in a multi-layered structure.

2. The CMOS image sensor of claim 1, further comprising:
a first metal layer on the ILD layer;
a first inter metal dielectric (IMD) layer on the first metal layer;
the oxide semiconductor transistor layer on the first IMD layer;
a second IMD layer on the oxide semiconductor transistor layer; and
a second metal layer on the second IMD layer.

3. The CMOS image sensor of claim 1, further comprising:
a first inter metal dielectric (IMD) layer on the oxide semiconductor transistor layer;
a first metal layer on the first IMD layer;
a second IMD layer on the first metal layer; and
a second metal layer on the second IMD layer.

4. The CMOS image sensor of claim 1, further comprising:
a first metal layer on the ILD layer;
a first inter metal dielectric (IMD) layer on the first metal layer;
a second metal layer on the first IMD layer;
a second IMD layer on the second metal layer; and
the oxide semiconductor transistor layer on the second IMD layer.

5. The CMOS image sensor of claim 1, wherein the plurality of photodiodes are pairs of photodiodes including a floating diffusion region between each pair of the plurality of photodiodes.

6. The CMOS image sensor of claim 2, further comprising:
a third IMD layer, a color filter, and a micro lens sequentially formed on the second metal layer.

7. The CMOS image sensor of claim 2, further comprising:
a third IMD layer, a color filter, and a micro lens sequentially formed on an exposed surface of the plurality of photodiodes.

8. The CMOS image sensor of claim 5, wherein the plurality of photodiodes further include n-wells and p-type impurity regions on the n-wells.

9. The CMOS image sensor of claim 8, wherein the pairs of photodiodes further comprise:
transfer gates on surfaces between each of the plurality of photodiodes and the floating diffusion region,
wherein the n-wells, the floating diffusion region, and the transfer gates form transfer transistors.

10. The CMOS image sensor of claim 9, wherein the plurality of transistors include a plurality of reset transistors, a plurality of source follower transistors, and a plurality of selection transistors, each of which are transparent oxide semiconductor transistors.

11. The CMOS image sensor of claim 10, further comprising:
a plurality of output lines for outputting signals from the plurality of selection transistors, the plurality of output lines configured to connect to source regions of the plurality of selection transistors through vertically aligned first plugs.

12. The CMOS image sensor of claim 10, wherein the plurality of source follower transistors further include source regions configured to electrically connect to drain regions of the plurality of selection transistors and source regions of the plurality of reset transistors are configured to connect to the floating diffusion region through vertically aligned second plugs.

13. The CMOS image sensor of claim 10, wherein the plurality of wirings are formed across the plurality of photodiodes and configured to connect source regions of the plurality of reset transistors and gates of the plurality of source follower transistors.

14. The CMOS image sensor of claim 10, further comprising:
a plurality of selection lines configured to connect to gates of the plurality of selection transistors;
a plurality of transfer lines configured to connect to the transfer gates of the plurality of transfer transistors; and
a plurality of reset lines configured to connect to gates of the plurality of reset transistors.

15. The CMOS image sensor of claim 11, wherein the plurality of output lines are formed along the edges of each pair of the plurality of photodiodes and across the floating diffusion region.

16. The CMOS image sensor of claim 11, wherein the oxide semiconductor transistor layer further comprises a plurality of power source lines configured to apply an input voltage to drain regions of the plurality of reset transistors and the plurality of source follower transistors.

17. The CMOS image sensor of claim 16, wherein the plurality of reset transistors and the plurality of source follower transistors are connected to the same photodiode and receive the input voltage from different power source lines.

18. The CMOS image sensor of claim 16, wherein the plurality of power source lines are formed along the edges of each pair of the plurality of photodiodes and across the floating diffusion region, and
wherein the plurality of output lines and the plurality of power source lines are configured to overlap each other in a horizontal direction and have different heights in a vertical direction.

19. The CMOS image sensor of claim 16, wherein the plurality of reset transistors are above the floating diffusion region.

20. The CMOS image sensor of claim 17, wherein the plurality of output lines and the plurality of power source lines are aligned perpendicular to the arrangement of the plurality of source follower transistors and the plurality of selection transistors.

21. The CMOS image sensor of claim 19, wherein the plurality of source follower transistors and the plurality of selection transistors are arranged in a single row on opposite sides of the plurality of reset transistors and along the edges of the pairs of the photodiodes at the center in a horizontal direction.

22. The CMOS image sensor of claim 14, wherein the plurality of selection lines are configured to connect to the gates of the selection transistors through vertically aligned third plugs.

23. The CMOS image sensor of claim 14, wherein the plurality of reset lines are above the plurality of reset transistors and overlap each other in a horizontal direction, and
wherein the plurality of selection lines, the plurality of transfer lines, and the plurality of reset lines are arranged parallel to each other.

24. The CMOS image sensor of claim 22, wherein the plurality of selection lines are above the plurality of source follower transistors and the plurality of selection transistors,
the plurality of selection lines, the plurality of source follower transistors and the plurality of selection transistors configured to overlap each other in a horizontal direction.

25. The CMOS image sensor of claim 22, wherein the plurality of transfer lines are connected to the transfer gates of the plurality of transfer transistors through vertically aligned fourth plugs.

26. The CMOS image sensor of claim 25, wherein two of the plurality of transfer lines are on both sides of the plurality of reset lines, each of the plurality of transfer lines being formed across the transfer gates.

27. A method of manufacturing a complementary metal oxide semiconductor (CMOS) image sensor comprising:
forming an inter-layer dielectric (ILD) layer on a plurality of photodiodes arranged in a two-dimensional array; and
forming an oxide semiconductor transistor layer on the ILD layer including a plurality of transistors and a plurality of wirings arranged to overlap each other along the edges of the plurality of photodiodes in a multi-layered structure.

28. The method of claim 27, wherein forming the ILD layer includes forming the plurality of photodiodes as pairs including a floating diffusion region between each pair of the plurality of photodiodes.

29. The method of claim 28, wherein forming the ILD layer includes forming the plurality of photodiodes including n-wells and forming p-type impurity regions on the n-wells.

30. The method of claim 29, wherein forming the pairs of photodiodes further comprises:
forming transfer gates on surfaces between each of the plurality of photodiodes and the floating diffusion region,
wherein the n-wells, the floating diffusion region, and the transfer gates form transfer transistors.

31. The method of claim 30, wherein forming the plurality of transistors includes forming a plurality of reset transistors, a plurality of source follower transistors, and a plurality of selection transistors, each of which are transparent oxide semiconductor transistors.

* * * * *